United States Patent
Harper

(10) Patent No.: US 10,461,406 B2
(45) Date of Patent: Oct. 29, 2019

(54) LOOP ANTENNA WITH INTEGRATED PROXIMITY SENSING

(71) Applicant: Microsoft Technology Licensing, LLC, Redmond, WA (US)

(72) Inventor: Marc Harper, Seattle, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 216 days.

(21) Appl. No.: 15/412,997

(22) Filed: Jan. 23, 2017

(65) Prior Publication Data
US 2018/0212313 A1  Jul. 26, 2018

(51) Int. Cl.
*H01Q 1/24* (2006.01)
*H01Q 7/00* (2006.01)
(Continued)

(52) U.S. Cl.
CPC .............. *H01Q 1/245* (2013.01); *H01Q 1/243* (2013.01); *H01Q 1/50* (2013.01); *H01Q 5/321* (2015.01);
(Continued)

(58) Field of Classification Search
CPC ........ H01Q 1/243; H01Q 5/321; H01Q 5/328; H01Q 1/50; H01Q 1/245
(Continued)

(56) References Cited

U.S. PATENT DOCUMENTS 4,016,490 A  4/1977 Weckenmann et al.
4,729,129 A  3/1988 Koerner
(Continued)

FOREIGN PATENT DOCUMENTS

AU  2014202603 B2  7/2015
CN  1123476 A  5/1996
(Continued)

OTHER PUBLICATIONS

Mrazovac, et al., "Reaching the Next Level of Indoor Human Presence Detection: An RF Based Solution", In Proceedings of the 11th International Conference on Telecommunication in Modern Satellite, Cable and Broadcasting Services, vol. 1, Oct. 16, 2013, 4 Pages.
(Continued)

*Primary Examiner* — Huedung X Mancuso
(74) *Attorney, Agent, or Firm* — Holzer Patel Drennan

(57) ABSTRACT

An antenna assembly that generally combines RF communication circuitry and proximity sensing circuitry. The antenna assembly utilizes a pair of conductive elements (e.g., loop antenna structures) that are parasitically (e.g., capacitively) driven by a directly fed RF feed antenna. The pair of conductive elements are selectively tunable to communicate in a frequency band of RF communication signals by a pair of RF tuning switches. The pair of conductive elements are also utilized as electrodes for proximity sensing by a capacitive proximity sensor module. The proximity sensing module outputs a low frequency signal (as opposed to the high frequency RF signal) to the pair of conductive elements for proximity sensing. The RF tuning switches are isolated from the low frequency signal by a pair of capacitors. The capacitive proximity sensing circuitry is isolated from the RF communication signals by a pair of inductors.

17 Claims, 4 Drawing Sheets

(51) Int. Cl.
*H03K 17/955* (2006.01)
*H01Q 1/50* (2006.01)
*H01Q 9/42* (2006.01)
*H01Q 5/321* (2015.01)
*H01Q 5/328* (2015.01)
*H01Q 5/371* (2015.01)

(52) U.S. Cl.
CPC .............. *H01Q 5/328* (2015.01); *H01Q 5/371* (2015.01); *H01Q 7/005* (2013.01); *H01Q 9/42* (2013.01); *H03K 17/955* (2013.01)

(58) Field of Classification Search
USPC ........................................................ 343/702
See application file for complete search history.

(56) References Cited

U.S. PATENT DOCUMENTS

| | | | |
|---|---|---|---|
| 4,806,944 | A | 2/1989 | Jacomb-Hood |
| 5,166,679 | A | 11/1992 | Vranish et al. |
| 5,212,621 | A | 5/1993 | Panter |
| 5,363,051 | A | 11/1994 | Jenstrom et al. |
| 5,408,690 | A | 4/1995 | Ishikawa et al. |
| 5,564,086 | A | 10/1996 | Cygan et al. |
| 6,178,310 | B1 | 1/2001 | Jeong |
| 6,657,595 | B1 | 12/2003 | Phillips et al. |
| 6,989,745 | B1 | 1/2006 | Milinusic et al. |
| 7,009,944 | B1 | 3/2006 | Hulbert |
| 7,053,629 | B2 | 5/2006 | Nevermann |
| 7,062,288 | B2 | 6/2006 | Raaf et al. |
| 7,071,776 | B2 | 7/2006 | Forrester et al. |
| 7,124,193 | B1 | 10/2006 | Leung et al. |
| 7,146,139 | B2 | 12/2006 | Nevermann |
| 7,151,382 | B1 | 12/2006 | Kean et al. |
| 7,162,264 | B2 | 1/2007 | Vance |
| 7,167,093 | B2 | 1/2007 | Fergusson |
| 7,541,874 | B2 | 6/2009 | Maeda et al. |
| 7,729,715 | B2 | 6/2010 | Love et al. |
| 7,917,175 | B2 | 3/2011 | Song et al. |
| 8,063,375 | B2 | 11/2011 | Cobbinah et al. |
| 8,134,461 | B2 | 3/2012 | Van Doorn |
| 8,208,423 | B2 | 6/2012 | Liu et al. |
| 8,213,982 | B2 | 7/2012 | Marlett et al. |
| 8,269,511 | B2 | 9/2012 | Jordan |
| 8,324,549 | B2 | 12/2012 | Romero et al. |
| 8,326,385 | B2 | 12/2012 | Brogle et al. |
| 8,401,851 | B2 | 3/2013 | Bushey et al. |
| 8,417,296 | B2 | 4/2013 | Caballero et al. |
| 8,432,322 | B2 | 4/2013 | Amm et al. |
| 8,442,572 | B2 | 5/2013 | Borran et al. |
| 8,466,839 | B2 | 6/2013 | Schlub et al. |
| 8,483,632 | B2 | 7/2013 | Asrani et al. |
| 8,515,496 | B2 | 8/2013 | Cheng et al. |
| 8,520,586 | B1 | 8/2013 | Husted et al. |
| 8,547,952 | B2 | 10/2013 | Liu et al. |
| 8,548,388 | B2 | 10/2013 | Chiu et al. |
| 8,559,999 | B2 | 10/2013 | Hu et al. |
| 8,565,205 | B2 | 10/2013 | Ho et al. |
| 8,577,289 | B2 | 11/2013 | Schlub et al. |
| 8,630,596 | B2 | 1/2014 | Harel et al. |
| 8,723,531 | B2 | 5/2014 | Harrison |
| 8,723,749 | B2 | 5/2014 | Lin et al. |
| 8,775,103 | B1 | 7/2014 | Jayaraj et al. |
| 8,781,437 | B2 | 7/2014 | Ngai et al. |
| 8,792,930 | B1 | 7/2014 | Gopalakrishnan et al. |
| 8,798,695 | B1 | 8/2014 | Zheng et al. |
| 8,860,526 | B2 | 10/2014 | Manssen et al. |
| 8,922,443 | B2 * | 12/2014 | Zhu .................. H01Q 1/243 343/702 |
| 8,975,903 | B2 | 3/2015 | Salter et al. |
| 9,093,752 | B2 | 7/2015 | Yarga et al. |
| 9,325,355 | B2 | 4/2016 | Pecen et al. |
| 9,337,833 | B2 | 5/2016 | Siska |
| 9,354,698 | B2 * | 5/2016 | Alameh ................. G06F 3/044 |
| 9,466,872 | B2 | 10/2016 | Sanchez et al. |
| 9,531,420 | B1 | 12/2016 | Prendergast et al. |
| 9,563,316 | B2 | 2/2017 | Standing et al. |
| 9,886,156 | B2 | 2/2018 | Standing et al. |
| 10,044,095 | B2 | 8/2018 | Mercer et al. |
| 10,055,072 | B2 | 8/2018 | Nakanishi et al. |
| 2002/0009976 | A1 | 1/2002 | Rashidi |
| 2002/0039028 | A1 | 4/2002 | Douglas et al. |
| 2002/0175814 | A1 | 11/2002 | Wadlow et al. |
| 2003/0021608 | A1 | 1/2003 | Morita et al. |
| 2003/0029028 | A1 | 2/2003 | Watanabe et al. |
| 2003/0064732 | A1 | 4/2003 | Mcdowell et al. |
| 2003/0064761 | A1 | 4/2003 | Nevermann |
| 2003/0210203 | A1 | 11/2003 | Phillips et al. |
| 2003/0214310 | A1 | 11/2003 | Mcintosh |
| 2003/0228846 | A1 | 12/2003 | Berliner et al. |
| 2004/0021608 | A1 | 2/2004 | Kojima et al. |
| 2004/0075613 | A1 | 4/2004 | Jarmuszewski et al. |
| 2004/0108957 | A1 | 6/2004 | Umehara et al. |
| 2004/0113847 | A1 | 6/2004 | Qi et al. |
| 2004/0160378 | A1 | 8/2004 | Abrams et al. |
| 2004/0222925 | A1 | 11/2004 | Fabrega-sanchez et al. |
| 2005/0017906 | A1 | 1/2005 | Man et al. |
| 2005/0073507 | A1 | 4/2005 | Richter et al. |
| 2005/0093623 | A1 | 5/2005 | Ranganathan |
| 2005/0093624 | A1 | 5/2005 | Forrester et al. |
| 2005/0184914 | A1 | 8/2005 | Ollikainen et al. |
| 2006/0244663 | A1 | 11/2006 | Fleck et al. |
| 2007/0037619 | A1 | 2/2007 | Matsunaga et al. |
| 2007/0111681 | A1 | 5/2007 | Alberth et al. |
| 2007/0120745 | A1 | 5/2007 | Qi et al. |
| 2007/0122307 | A1 | 5/2007 | Da costa cabral e gil et al. |
| 2008/0051165 | A1 | 2/2008 | Burgan et al. |
| 2008/0055160 | A1 | 3/2008 | Kim et al. |
| 2008/0158065 | A1 | 7/2008 | Wee |
| 2008/0218493 | A1 | 9/2008 | Patten et al. |
| 2008/0254836 | A1 | 10/2008 | Qi et al. |
| 2009/0033562 | A1 | 2/2009 | Takeuchi et al. |
| 2009/0047998 | A1 | 2/2009 | Alberth, Jr. |
| 2009/0230884 | A1 | 9/2009 | Van Doorn |
| 2009/0253459 | A1 | 10/2009 | Naganuma et al. |
| 2009/0295648 | A1 | 12/2009 | Dorsey et al. |
| 2009/0305742 | A1 | 12/2009 | Caballero et al. |
| 2009/0325511 | A1 | 12/2009 | Kim |
| 2010/0026664 | A1 | 2/2010 | Geaghan |
| 2010/0052997 | A1 | 3/2010 | Kan et al. |
| 2010/0056210 | A1 | 3/2010 | Bychkov et al. |
| 2010/0067419 | A1 | 3/2010 | Liu et al. |
| 2010/0113111 | A1 | 5/2010 | Wong et al. |
| 2010/0234058 | A1 | 9/2010 | Hu et al. |
| 2010/0234081 | A1 | 9/2010 | Wong et al. |
| 2010/0279751 | A1 | 11/2010 | Pourseyed et al. |
| 2010/0283671 | A1 | 11/2010 | Levin et al. |
| 2010/0283691 | A1 | 11/2010 | Su et al. |
| 2010/0317302 | A1 | 12/2010 | Greenwood et al. |
| 2010/0321325 | A1 | 12/2010 | Springer et al. |
| 2011/0001675 | A1 | 1/2011 | Lee |
| 2011/0012793 | A1 * | 1/2011 | Amm .................. H01Q 1/243 343/702 |
| 2011/0012794 | A1 | 1/2011 | Schlub et al. |
| 2011/0043408 | A1 | 2/2011 | Shi et al. |
| 2011/0063042 | A1 | 3/2011 | Mendolia et al. |
| 2011/0117973 | A1 | 5/2011 | Asrani et al. |
| 2011/0124363 | A1 | 5/2011 | Calvarese et al. |
| 2011/0157077 | A1 | 6/2011 | Martin et al. |
| 2011/0199267 | A1 | 8/2011 | Hayashi |
| 2011/0222469 | A1 | 9/2011 | Ali et al. |
| 2011/0250928 | A1 | 10/2011 | Schlub et al. |
| 2011/0298669 | A1 | 12/2011 | Rao et al. |
| 2012/0021707 | A1 | 1/2012 | Forrester et al. |
| 2012/0021800 | A1 | 1/2012 | Wilson et al. |
| 2012/0023225 | A1 | 1/2012 | Imes et al. |
| 2012/0044115 | A1 | 2/2012 | Mccaughey et al. |
| 2012/0071195 | A1 | 3/2012 | Chakraborty et al. |
| 2012/0074961 | A1 | 3/2012 | Herrmann |
| 2012/0077538 | A1 | 3/2012 | Yun |
| 2012/0133561 | A1 | 5/2012 | Konanur et al. |
| 2012/0147801 | A1 | 6/2012 | Ho et al. |
| 2012/0164962 | A1 | 6/2012 | Lin et al. |
| 2012/0172079 | A1 | 7/2012 | Baldemair et al. |

(56) References Cited

U.S. PATENT DOCUMENTS

| | | |
|---|---|---|
| 2012/0178494 A1 | 7/2012 | Haim et al. |
| 2012/0190398 A1 | 7/2012 | Leukkunen |
| 2012/0214422 A1 | 8/2012 | Shi et al. |
| 2012/0223865 A1 | 9/2012 | Li et al. |
| 2012/0231784 A1 | 9/2012 | Kazmi |
| 2012/0270519 A1 | 10/2012 | Ngai et al. |
| 2012/0270592 A1 | 10/2012 | Ngai et al. |
| 2012/0276861 A1 | 11/2012 | Isobe et al. |
| 2012/0295554 A1 | 11/2012 | Greene et al. |
| 2012/0298497 A1 | 11/2012 | Maeda et al. |
| 2012/0299772 A1 | 11/2012 | Shtrom et al. |
| 2012/0315847 A1 | 12/2012 | Li et al. |
| 2012/0329517 A1 | 12/2012 | Elin |
| 2012/0329524 A1* | 12/2012 | Kent .................. G06F 3/044 455/566 |
| 2013/0005413 A1 | 1/2013 | Brogle et al. |
| 2013/0016621 A1 | 1/2013 | Kil et al. |
| 2013/0026846 A1 | 1/2013 | Gianesello et al. |
| 2013/0033400 A1 | 2/2013 | Chiang |
| 2013/0045700 A1 | 2/2013 | Stallman et al. |
| 2013/0050046 A1* | 2/2013 | Jarvis .................. H01Q 1/243 343/852 |
| 2013/0051261 A1 | 2/2013 | Kazmi et al. |
| 2013/0060517 A1 | 3/2013 | Sanchez |
| 2013/0120257 A1 | 5/2013 | Park et al. |
| 2013/0122827 A1 | 5/2013 | Ali et al. |
| 2013/0127677 A1 | 5/2013 | Lin et al. |
| 2013/0137487 A1 | 5/2013 | Sato |
| 2013/0149957 A1 | 6/2013 | Desclos et al. |
| 2013/0157564 A1 | 6/2013 | Curtis et al. |
| 2013/0169348 A1 | 7/2013 | Shi |
| 2013/0178167 A1 | 7/2013 | Lockerbie et al. |
| 2013/0178174 A1 | 7/2013 | Geris et al. |
| 2013/0203363 A1 | 8/2013 | Gratt et al. |
| 2013/0210477 A1 | 8/2013 | Peter |
| 2013/0217342 A1 | 8/2013 | Abdul-gaffoor et al. |
| 2013/0241670 A1 | 9/2013 | Mikhemar et al. |
| 2013/0278474 A1 | 10/2013 | Lenormand et al. |
| 2013/0293244 A1 | 11/2013 | Leek |
| 2013/0300618 A1 | 11/2013 | Yarga et al. |
| 2013/0310105 A1 | 11/2013 | Sagae et al. |
| 2013/0310106 A1 | 11/2013 | Wang et al. |
| 2013/0314365 A1 | 11/2013 | Woolley et al. |
| 2013/0335291 A1 | 12/2013 | Judson et al. |
| 2014/0015595 A1 | 1/2014 | Van ausdall et al. |
| 2014/0021801 A1 | 1/2014 | Kao et al. |
| 2014/0066124 A1 | 3/2014 | Novet |
| 2014/0071008 A1 | 3/2014 | Desclos et al. |
| 2014/0078094 A1 | 3/2014 | Yang |
| 2014/0087663 A1 | 3/2014 | Burchill et al. |
| 2014/0098491 A1 | 4/2014 | Wang |
| 2014/0098693 A1 | 4/2014 | Tabet et al. |
| 2014/0128032 A1 | 5/2014 | Muthukumar |
| 2014/0139380 A1 | 5/2014 | Ouyang et al. |
| 2014/0141733 A1 | 5/2014 | Wong et al. |
| 2014/0152121 A1 | 6/2014 | Ku |
| 2014/0155000 A1 | 6/2014 | Erkens |
| 2014/0159980 A1 | 6/2014 | Finegold |
| 2014/0173269 A1 | 6/2014 | Varoglu et al. |
| 2014/0176938 A1 | 6/2014 | Yang et al. |
| 2014/0177371 A1 | 6/2014 | Ellis et al. |
| 2014/0206297 A1 | 7/2014 | Schlub et al. |
| 2014/0253392 A1 | 9/2014 | Yarga et al. |
| 2014/0274188 A1 | 9/2014 | Thorson et al. |
| 2014/0274189 A1 | 9/2014 | Moller et al. |
| 2014/0280450 A1 | 9/2014 | Luna |
| 2014/0292587 A1 | 10/2014 | Yarga et al. |
| 2014/0307570 A1 | 10/2014 | Hong |
| 2014/0315592 A1 | 10/2014 | Schlub et al. |
| 2014/0357207 A1 | 12/2014 | Ma |
| 2014/0357313 A1 | 12/2014 | Mercer et al. |
| 2014/0370929 A1 | 12/2014 | Khawand et al. |
| 2015/0031408 A1 | 1/2015 | Kalla et al. |
| 2015/0053575 A1 | 2/2015 | Bridges et al. |
| 2015/0141080 A1 | 5/2015 | Standing |
| 2015/0169093 A1 | 6/2015 | Nakao |
| 2015/0177371 A1 | 6/2015 | Abbasi et al. |
| 2015/0200444 A1 | 7/2015 | Mercer et al. |
| 2015/0201385 A1 | 7/2015 | Mercer et al. |
| 2015/0201387 A1 | 7/2015 | Khawand et al. |
| 2015/0227252 A1 | 8/2015 | Ivanov et al. |
| 2015/0288074 A1 | 10/2015 | Harper et al. |
| 2015/0303568 A1 | 10/2015 | Yarga et al. |
| 2015/0382307 A1 | 12/2015 | Harper et al. |
| 2016/0049978 A1 | 2/2016 | Mercer et al. |
| 2016/0064801 A1 | 3/2016 | Han et al. |
| 2016/0065260 A1 | 3/2016 | Heikura et al. |
| 2016/0098053 A1 | 4/2016 | Khawand et al. |
| 2016/0164563 A1 | 6/2016 | Khawand et al. |
| 2016/0204836 A1 | 7/2016 | Lee et al. |
| 2016/0209962 A1 | 7/2016 | Nurmi |
| 2017/0082887 A1 | 3/2017 | Kubota et al. |
| 2017/0102802 A1 | 4/2017 | Standing et al. |
| 2017/0192478 A1 | 7/2017 | Mercer et al. |
| 2018/0046282 A1 | 2/2018 | Standing et al. |
| 2018/0209817 A1 | 7/2018 | Harper et al. |
| 2018/0248249 A1 | 8/2018 | Mercer et al. |

FOREIGN PATENT DOCUMENTS

| | | |
|---|---|---|
| CN | 1179864 A | 4/1998 |
| CN | 1413408 A | 4/2003 |
| CN | 100504407 C | 6/2009 |
| CN | 101958455 A | 1/2011 |
| CN | 201805000 U | 4/2011 |
| CN | 102064812 A | 5/2011 |
| CN | 102077234 A | 5/2011 |
| CN | 102089989 A | 6/2011 |
| CN | 202276339 U | 6/2012 |
| CN | 102714346 A | 10/2012 |
| CN | 102835036 A | 12/2012 |
| CN | 103248747 A | 8/2013 |
| EP | 0643421 A2 | 5/1998 |
| EP | 1298809 A2 | 4/2003 |
| EP | 1469550 A3 | 12/2004 |
| EP | 1732167 A1 | 12/2006 |
| EP | 2015548 B1 | 2/2010 |
| EP | 2276108 A1 | 1/2011 |
| EP | 2381527 A1 | 10/2011 |
| EP | 2383364 A1 | 11/2011 |
| EP | 2405534 A1 | 1/2012 |
| EP | 2410661 A1 | 1/2012 |
| EP | 2509229 A1 | 10/2012 |
| EP | 2568605 A1 | 3/2013 |
| EP | 2787780 A1 | 10/2014 |
| GB | 2380359 A | 4/2003 |
| GB | 2409345 A | 6/2005 |
| GB | 2518627 A | 4/2015 |
| JP | 2002043957 A | 2/2002 |
| JP | 2007194995 A | 8/2007 |
| WO | 0042797 A1 | 7/2000 |
| WO | 0148858 A3 | 5/2002 |
| WO | 2004015813 A1 | 2/2004 |
| WO | 2004091046 A1 | 10/2004 |
| WO | 2005018046 A1 | 2/2005 |
| WO | 2007043150 A1 | 4/2009 |
| WO | 2009149023 A1 | 12/2009 |
| WO | 2011051554 A1 | 5/2011 |
| WO | 2011058128 A1 | 5/2011 |
| WO | 2012061582 A1 | 5/2012 |
| WO | 2012091651 A1 | 7/2012 |
| WO | 2012113754 A1 | 8/2012 |
| WO | 2012122113 A1 | 9/2012 |
| WO | 2012122116 A1 | 9/2012 |
| WO | 2012143936 A1 | 10/2012 |
| WO | 2012152103 A1 | 11/2012 |
| WO | 2012176217 A1 | 12/2012 |
| WO | 2013011352 A1 | 1/2013 |
| WO | 2013101106 A1 | 7/2013 |
| WO | 2013103948 A2 | 7/2013 |
| WO | 2013141791 A1 | 9/2013 |
| WO | 2013165419 A1 | 11/2013 |
| WO | 2013169527 A1 | 11/2013 |
| WO | 2014036532 A1 | 3/2014 |

(56) References Cited

FOREIGN PATENT DOCUMENTS

| WO | 2015134117 A1 | 9/2015 |
|---|---|---|
| WO | 2015138248 A1 | 9/2015 |
| WO | 2016111897 A1 | 7/2016 |

OTHER PUBLICATIONS

"Non Final Office Action Issued in U.S. Appl. No. 15/384,742", dated Feb. 10, 2017, 6 Pages.
"Non Final Office Action Issued in U.S. Appl. No. 15/384,742", dated May 30, 2017, 9 Pages.
"Application as Filed in U.S. Appl. No. 15/413,196", filed Jan. 23, 2017, 35 Pages.
"Non Final Office Action Issued in U.S. Appl. No. 15/793,666", dated Mar. 30, 2018, 7 Pages.
"Non Final Office Action Issued in U.S. Appl. No. 15/793,666", dated Jan. 8, 2018, 6 Pages.
"First Office Action and Search Report Issued in Chinese Patent Application No. 201380055749.X", dated Jun. 6, 2016, 12 Pages.
"Second Office Action Issued in Chinese Patent Application No. 201380055749.X", dated Jan. 25, 2017, 10 Pages.
Holopainen, et al., "Broadband Equivalent Circuit Model for Capacitive Coupling Element-Based Mobile Terminal Antenna", In IEEE Antennas and Wireless Propagation Letters, vol. 9, Jul. 8, 2010, pp. 716-719.
"First Office Action and Search Report Issued in Chinese Patent Application No. 201480031132.9", dated Nov. 2, 2016, 10 Pages.
"Office Action and Search Report Issued in Chinese Patent Application No. 201480033869.4", dated Dec. 19, 2016, 7 Pages.
"Office Action and Search Report Issued in Chinese Patent Application No. 201480063903.2", dated Apr. 19, 2017, 11 Pages.
"Office Action and Search Report Issued in Chinese Patent Application No. 201480072727.9", dated Apr. 3, 2018, 7 Pages. (W/o English Translation).
"Office Action Issued in Chinese Patent Application No. 201480072893.9", dated Apr. 3, 2018, 14 Pages.
Bonev, et al., "Parmetric Study of Antenna with Parasitic Element for Improving the Hearing Aids Compatibility of Mobile Phones and the Specific Absorption Rate in the Head", In Proceedings of the in Progress in Electromagnetics Research Symposium, Mar. 20, 2011, pp. 1885-1889.
Curto, et al., "Circular Loop Antenna Operating at 434 MHz for Medical Applications: Loop-Tissue Interaction", In Proceeding of IET Irish Signals and Systems Conference, Jun. 28, 2006, pp. 327-331.
Hochwald, et al., "Minimizing Exposure to Electromagnetic Radiation in Portable Devices", In Proceedings of Information Theory and Applications Workshop, Feb. 5, 2012, 7 Pages.
Wang, David, "FDC1004: Basics of Capacitive Sensing and Applications", In Texas Instruments Application Report, SNOA927, Dec. 2014, 12 Pages.
Toit, Riaan Du, "Using Proximity Sensing to Meet Mobile Device FCC SAR Regulations", Retrieved from http://www.embedded.com/print/4371201, Apr. 17, 2012, 5 Pages.
Sterner, et al., "Development of an Antenna Sensor for Occupant Detection in Passenger Transportation", In Procedia Engineering, vol. 47, Sep. 9, 2012, pp. 178-183.
"Non Final Office Action Issued in U.S. Appl. No. 14/927,287", dated Dec. 21, 2015, 28 Pages.
"Non Final Office Action Issued in U.S. Appl. No. 14/987,964", dated Nov. 30, 2016, 8 Pages.
Poutanen, et al., "Behavior of Mobile Terminal Antennas near Human Tissue at a Wide Frequency Range", In Proceedings of the International Workshop on Antenna Technology: Small Antennas and Novel Metamaterials, Mar. 4, 2008, 4 Pages.
"Digital, Silicon Microphone has 2.6×1.6 mm² Footprint", Retrieved from http://news.thomasnet.com/fullstory/digital-silicon-microphone-has-2-6-x-1-6-mm-footprint-471386, Dec. 28, 2005, 2 Pages.

"Low SAR Solution for Tablet PC", Retrieved from http://www.auden.com.tw/TRC/webspace/disk/AudenSARSolutiondatasheet_110927.pdf, Sep. 27, 2011, 2 pages.
"SAR Evaluation Considerations for Laptop, Notebook, Netbook and Tablet Computers", In Federal Communications Commission Office of Engineering and Technology Laboratory Division, May 28, 2013, 14 Pages.
"Semtech Launches Smart Proximity Sensor for Short-Range Human Presence Detection & SAR Regulations in Mobile & Tablet PC Applications", Retrieved from https://investors.semtech.com/news-releases/news-release-details/semtech-launches-smart-proximity-sensor-short-range-human, Jul. 24, 2012, 2 Pages.
"Office Action Issued in United Kingdom Patent Application No. 1219096.3", dated Jan. 28, 2016, 5 Pages.
"Non Final Office Action Issued in U.S. Appl. No. 13/905,088", dated Mar. 23, 2015, 38 Pages.
"Final Office Action Issued in U.S. Appl. No. 13/918,846", dated Mar. 2, 2016, 20 Pages.
"Final Office Action Issued in U.S. Appl. No. 13/918,846", dated Oct. 26, 2016, 25 Pages.
"Non Final Office Action Issued in U.S. Appl. No. 13/918,846", dated Jun. 14, 2016, 21 Pages.
"Non Final Office Action Issued in U.S. Appl. No. 13/918,846", dated Sep. 23, 2015, 17 Pages.
"Non Final Office Action Issued in U.S. Appl. No. 14/086,866", dated Oct. 17, 2016, 7 Pages.
"Non Final Office Action Issued in U.S. Appl. No. 14/086,866", dated May 19, 2016, 7 Pages.
"Final Office Action Issued in U.S. Appl. No. 14/152,086", dated Nov. 30, 2015, 19 Pages.
"Non Final Office Action Issued in U.S. Appl. No. 14/152,086", dated Jul. 22, 2015, 14 Pages.
"Non Final Office Action Issued in U.S. Appl. No. 14/152,351", dated Feb. 20, 2015, 10 Pages.
"Final Office Action Issued in U.S. Appl. No. 14/152,529", dated Jan. 22, 2016, 18 Pages.
"Non Final Office Action Issued in U.S. Appl. No. 14/152,529", dated Sep. 22, 2015, 18 Pages.
"Final Office Action Issued in U.S. Appl. No. 14/152,652", dated Dec. 23, 2015, 9 Pages.
"Non Final Office Action Issued in U.S. Appl. No. 14/152,652", dated Apr. 18, 2016, 9 Pages.
"Non Final Office Action Issued in U.S. Appl. No. 14/152,652", dated Jul. 16, 2015, 9 Pages.
Myllymaki, Sami, "Capacitive Antenna Sensor for User Proximity Recognition", Academic Dissertation to be Presented with the Assent of the Doctoral Training Committee of Technology and Natural Sciences, Nov. 30, 2012, 59 Pages.
"Final Office Action Issued in U.S. Appl. No. 14/320,320", dated Jul. 29, 2016, 10 Pages.
"Non Final Office Action Issued in U.S. Appl. No. 14/320,320", dated Jan. 21, 2016, 9 Pages.
"Non Final Office Action Issued in U.S. Appl. No. 14/506,478", dated Jul. 1, 2016, 10 Pages.
"Final Office Action Issued in U.S. Appl. No. 14/562,212", dated Jun. 17, 2016, 17 Pages.
"Non Final Office Action Issued in U.S. Appl. No. 14/562,212", dated Dec. 18, 2015, 16 Pages.
"Final Office Action Issued in U.S. Appl. No. 14/927,287", dated May 11, 2016, 34 Pages.
"Office Action Issued in Colombian Patent Application No. 20160000122", dated Aug. 19, 2016, 2 Pages.
Osoinach, Bryce, "Proximity Capacitive Sensor Technology for Touch Sensing Applications", In White Paper of Proximity Sensing, 2007, 12 Pages.
Ozyalcin, et al., "SAR Simulations in Wireless Communication and Safety Discussions in the Society", In Turkish Journal of Electrical Engineering & Computer Sciences, vol. 10, Issue 2, May 23, 2002, pp. 411-426, 16 Pages.
"International Preliminary Report on Patentability Issued in PCT Application No. PCT/US2013/066441", dated May 7, 2015, 9 Pages.

(56) References Cited

OTHER PUBLICATIONS

"International Search Report and Written Opinion Issued in PCT Application No. PCT/US2013/066441", dated Dec. 12, 2013, 12 Pages.
"International Preliminary Report on Patentability Issued in PCT Application No. PCT/US2014/039479", dated Jun. 15, 2015, 8 Pages.
"International Search Report and Written Opinion Issued in PCT Application No. PCT/US2014/039479", dated Sep. 19, 2014, 11 Pages.
"International Search Report and Written Opinion Issued in PCT Application No. PCT/US2014/042023", dated Aug. 29, 2014, 11 Pages.
"Second Written Opinion Issued in PCT Application No. PCT/US2014/042023", dated Mar. 2, 2015, 6 Pages.
"International Preliminary Report on Patentability Issued in PCT Application No. PCT/US2014/065856", dated Feb. 10, 2016, 8 Pages.
"International Search Report and Written Opinion Issued in PCT Application No. PCT/US2014/065856", dated Feb. 4, 2015, 10 Pages.
"Second Written Opinion Issued in PCT Application No. PCT/US2014/065856", dated Oct. 13, 2015, 6 Pages.
"International Preliminary Report on Patentability Issued in PCT Application No. PCT/US2014/072411", dated Mar. 23, 2016, 8 Pages.
"International Search Report and Written Opinion Issued in PCT Patent Application No. PCT/US2014/072411", dated Mar. 27, 2015, 10 Pages.
"Second Written Opinion Issued in PCT Application No. PCT/US2014/072411", dated Nov. 26, 2015, 7 Pages.
"International Preliminary Report on Patentability Issued in PCT Application No. PCT/US2014/072412", dated Mar. 22, 2016, 7 Pages.
"International Search Report and Written Opinion Issued in PCT Patent Application No. PCT/US2014/072412", dated Mar. 30, 2015, 11 Pages.
"Second Written Opinion Issued in PCT Application No. PCT/US2014/072412", dated Dec. 4, 2015, 5 Pages.
"Updated International Search Report and Written Opinion Issued in PCT Application No. PCT/US2014/072412", dated Oct. 5, 2015, 11 Pages.
"International Preliminary Report on Patentability Issued in PCT Application No. PCT/US2014/072413", dated Mar. 24, 2016, 7 Pages.
"International Search Report and Written Opinion Issued in PCT Patent Application No. PCT/US2014/072413", dated Jul. 16, 2015, 16 Pages.
"Second Written Opinion Issued in PCT Application No. PCT/US2014/072413", dated Dec. 17, 2015, 6 Pages.
Rogerson, James, "Samsung Reveals a Folding Phone-To-Tablet Prototype", Retrieved from http://www.in.techradar.com/news/phone-and-communications/mobile-phones/Samsung-reveals-a-folding-phone-to-tablet-prototype/articleshow/38694064.cms, Nov. 7, 2013, 7 Pages.
"International Preliminary Report on Patentability Issued in PCT Application No. PCT/US2014/072414", dated Mar. 23, 2016, 7 Pages.
"International Search Report and Written Opinion Issued in PCT Patent Application No. PCT/US2014/072414", dated Apr. 14, 2015, 9 Pages.
"Second Written Opinion Issued in PCT Application No. PCT/US2014/072414", dated Dec. 9, 2015, 6 Pages.
"International Preliminary Report on Patentability Issued in PCT Application No. PCT/US2015/037563", dated Sep. 13, 2016, 7 Pages.

"International Search Report and Written Opinion Issued in PCT Application No. PCT/US2015/037563", dated Aug. 31, 2015, 10 Pages.
"Second Written Opinion Issued in PCT Application No. PCT/US2015/037563", dated Jun. 1, 2016, 5 Pages.
"International Preliminary Report on Patentability Issued in PCT Application No. PCT/US2015/052769", dated Sep. 29, 2016, 16 Pages.
"International Search Report and Written Opinion Issued in PCT Application No. PCT/US2015/052769", dated Feb. 17, 2016, 27 Pages.
"Second Written Opinion Issued in PCT Application No. PCT/US2015/052769", dated Jul. 7, 2016, 5 Pages.
"International Preliminary Report on Patentability Issued in PCT Application No. PCT/US2015/062851", dated Feb. 22, 2017, 9 Pages.
Poutanen, Juho, "Interaction Between Mobile Terminal Antenna and User", Thesis Submitted in Partial Fulfillment of the Requirements for the Degree of Master of Science, Oct. 9, 2007, 100 Pages.
"International Search Report and Written Opinion Issued in PCT Application No. PCT/US2015/062851", dated Feb. 5, 2016, 11 Pages.
"Second Written Opinion Issued in PCT Application No. PCT/US2015/062851", dated Oct. 28, 2016, 8 Pages.
"International Search Report and Written Opinion Issued in PCT Application No. PCT/US2018/012855", dated Apr. 11, 2018, 12 Pages.
"International Search Report and Written Opinion Issued in PCT Application No. PCT/US2016/069056", dated Mar. 31, 2017, 14 Pages.
"International Search Report and Written Opinion Issued in PCT Application No. PCT/US2018/012854", dated Apr. 10, 2018, 14 Pages.
Pal, et al., "Dual-Band Low-Profile Capacitively Coupled Beam-Steerable Square-Loop Antenna", In Journal of IEEE Transactions on Antennas and Propagation, vol. 62, Issue 3, Mar. 2014, pp. 1204-1211.
Chung, et al., "A dual-mode antenna for wireless charging and Near Field Communication", In Proceedings of EEE International Symposium on Antennas and Propagation & USNC/URSI National Radio Science Meeting, Jul. 24, 2015, 5 pages.
Ban, et al., "A Dual-Loop Antenna Design for Hepta-Band WWAN/LTE Metal-Rimmed Smartphone Applications", In Journal of IEEE Transactions on Antennas and Propagation, vol. 63, Issue 1, Jan. 2015, 8 pages.
Mumcu, et al., "Small Wideband Double-Loop Antennas Using Lumped Inductors and Coupling Capacitors", In Journal of IEEE Antennas and Wireless Propagation Letters, vol. 10, Feb. 4, 2011, 5 pages.
"Design of Printed Trace Differential Loop Antennas", http://www.silabs.com/Support%20Documents/TechnicalDocs/AN639.pdf, Retrieved on: Nov. 17, 2016, 28 pages.
Pal, et al., "A low-profile switched-beam dual-band capacitively coupled Square Loop Antenna", In Proceedings of Antennas and Propagation Conference, Nov. 11, 2013, 5 Pages.
Quddious, et al., "An inkjet printed meandered dipole antenna for RF passive sensing applications", In Proceedings of 10th European Conference on Antennas and Propagation, Apr. 2016, 4 Pages.
"Non-Final Office Action Issued in U.S. Appl. No. 15/413,196", dated Sep. 17, 2018, 12 Pages.
"Non-Final Office Action Issued in U.S. Appl. No. 15/822,945", dated Jul. 18, 2018, 10 Pages.
"Second Office Action and Search Report Issued in Chinese Patent Application No. 201480072727.9", dated Feb. 1, 2019, 20 Pages.
"Office Action Issued in Chinese Patent Application No. 201480072727.9", dated Jul. 8, 2019, 19 Pages.

* cited by examiner

LOOP ANTENNA WITH INTEGRATED PROXIMITY SENSING

BACKGROUND

Modern electronic devices typically employ high frequency radio communications, particularly mobile devices. Because human tissue can be negatively impacted (e.g., heated) by strong radio waves when the tissue is positioned close to a transmitting antenna, various governmental agencies and industry bodies have established standards to limit the radiofrequency (RF) power that is transmitted into human tissue. For example, a Specific Absorption Rate (SAR) test measures the RF power emitted into human tissue that is located in proximity to the RF transmitter. One approach for satisfying such SAR standards involves reducing the RF transmission power when a body (e.g., a human body part) is detected in close proximity to the RF transmitter. However, integrating proximity sensors and circuitry with radio communication components and computing components in the limited real estate of a mobile device is increasingly challenging as mobile devices continue to evolve (e.g., shrink, add functionality).

SUMMARY

Implementations described and claimed herein provide a device with an antenna assembly including a conductive element, a capacitive proximity sensor module electrically connected to the conductive element and configured to detect capacitance changes in the conductive element, and a radiofrequency (RF) feed antenna positioned to parasitically drive the conductive element to communicate in a frequency band of RF signals. Implementations also provide a method of parasitically driving the conductive element and detecting capacitance changes in the conductive element for proximity detection.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Other implementations are also described and recited herein

BRIEF DESCRIPTIONS OF THE DRAWINGS

DETAILED DESCRIPTIONS

In some jurisdictions, specific absorption rate (SAR) standards impose maximum energy absorption limits on electronic device manufacturers. These standards impose restrictions on the amount of electromagnetic radiation that may be emitted at any particular point within a given distance of a transmitting radiofrequency (RF) antenna. Particular attention is given to radiation limits at distances within a few centimeters from the device (e.g., 0-3 centimeters), where users are likely to place a human body part near the transmitting antenna. Such restrictions may be satisfied by reducing transmitted carrier signal strength when a body (e.g., a human body part) is detected in the proximity of the transmitter.

As mobile devices, such as laptops, tablets, smart phones, etc. continue to evolve (e.g., shrink in thickness, width, and height and add functionality) device real estate for various functional components is decreasing. Because a mobile device is expected to communicate in various RF communication bands while also complying with SAR standards various RF communication circuitry and proximity detecting circuitry are included in the device. Mobile devices may use a separate circuitry for RF communication and for proximity detection, which may occupy significant device real estate.

Implementations described herein provide an antenna assembly that generally combines RF communication circuitry and proximity sensing circuitry. The antenna assembly utilizes a pair of conductive elements (e.g., loop antenna structures) that are parasitically (e.g., capacitively) driven by a directly fed RF feed antenna. The pair of conductive elements are selectively tunable to communicate in a frequency band of RF communication signals by a pair of RF tuning switches. The pair of conductive elements are also utilized as electrodes for proximity sensing by a capacitive proximity sensor module. The proximity sensing module outputs a low frequency signal (as opposed to the high frequency RF signal) to the pair of conductive elements to detect capacitance changes in either or both conductive elements for proximity sensing. The RF tuning switches are isolated from the low frequency signal by a pair of capacitors, which perform as a low frequency signal block. The capacitive proximity sensing circuitry is isolated from the RF communication signals by a pair of inductors, which perform as a RF communication signal block.

Figure 1:
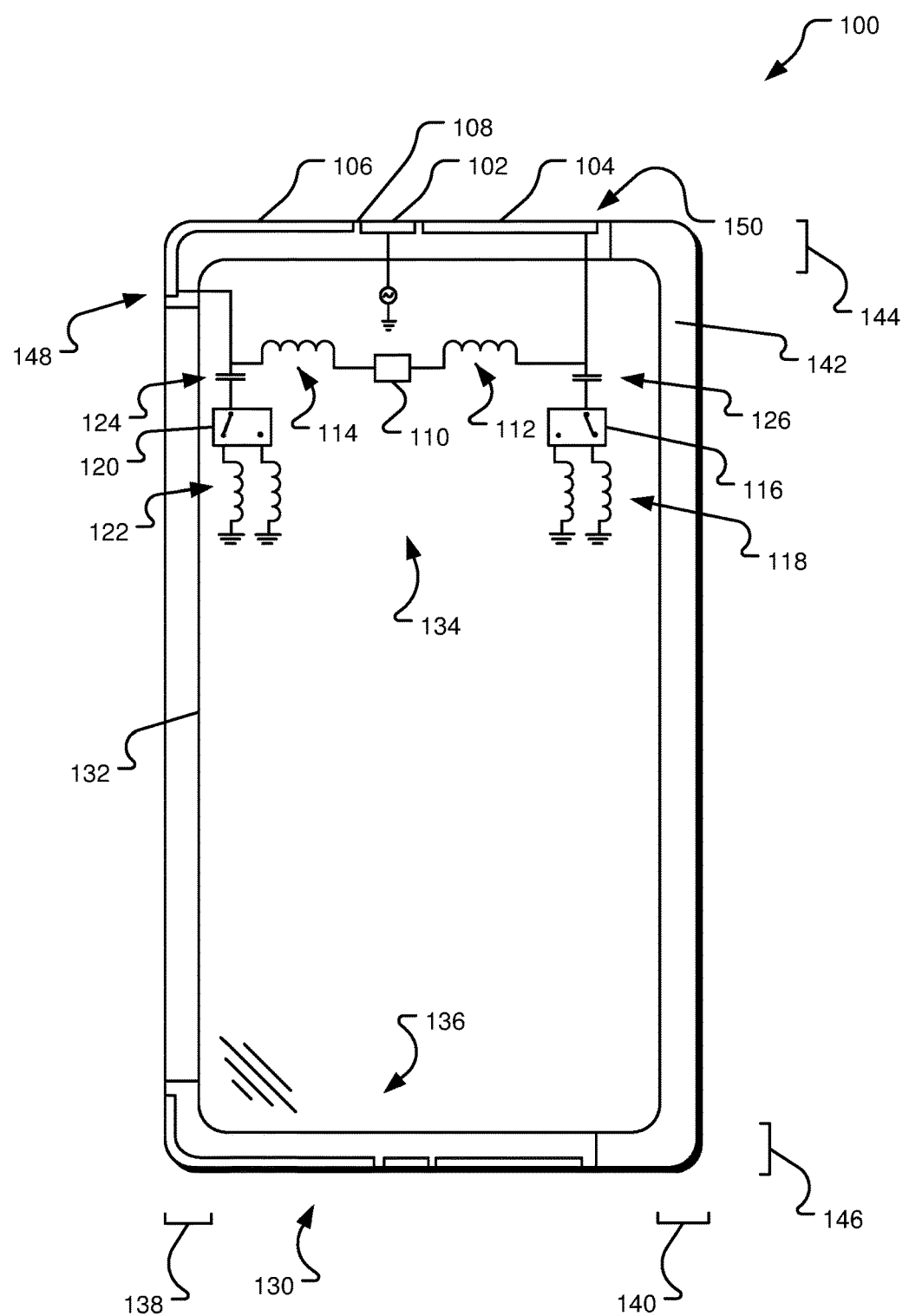
FIG. 1 illustrates an example wireless communication device.

FIG. 1 illustrates an example wireless communication device 100. In this example implementation, wireless communication device 100 is a mobile phone, but in other implementations, the wireless communication device could be any type of device that uses wireless communication protocols (e.g., 3G, 4G, LTE, Wi-Fi, Near Field Communication (NFC), Bluetooth®, GPS) such as a desktop computer, laptop computer, tablet, and other similar devices. In this implementation, the wireless communication device includes a display 132, and one or more antenna assemblies (e.g., antenna assemblies 134 and 136). The mobile device may include several antennas assemblies positioned in different locations on the mobile device. The antenna assemblies 134 and 136 are illustrated with conductive elements (e.g., conductive elements 104 and 106) positioned at a top edge 144 and bottom edge 146 of the mobile device 100. It should be understood that the antenna assemblies with conductive elements may be positioned under the display 132, on the back (not shown), on either side (e.g., sides 138 and 140) of the mobile device 100.

In various implementations, each of the antenna assemblies (e.g., the antenna assemblies 134 and 136) may each be configured to communicate in a different communication protocol. For example, the antenna assembly 134 may be configured for LTE communication while the antenna 136 may be configured for Wi-Fi communication. In the same or different implementations, the antenna assemblies may be configured to communication in the same protocol (e.g., LTE) but may be configured for MIMO communication. For example, the antenna assembly 134 may be a transmit and receive (Tx/Rx) while the antenna 136 may be configured to receive signals (Rx). Other antenna diversity configurations are contemplated.

The antenna assembly 134 includes the conductive elements 104 and 106, a radiofrequency (RF) feed antenna 102, and antenna circuitry/modules (e.g., elements 110 126). The conductive elements 104 and 106 may be metal plates and are positioned at an outer edge of the mobile device 100 to form a portion of an enclosure 142 of the mobile device 100. In the illustrated implementation, the conductive element 106 acts as a low band loop antenna (hereinafter referred to as "low band loop antenna 106") and the conductive element 104 acts as a high band loop antenna (hereinafter referred to as 'high band loop antenna 104"). The high band loop antenna 104 and the low band loop antenna 106 are parasitic loop antennas each having a first end and a second end (e.g., the low band loop antenna 106 has a first end 152 and a second end 154 and the high band loop antenna has a first end 148 and a second end 150). The low band loop antenna 106 and the high band loop antenna 104 are parasitic, meaning that the high band loop antenna 104 and the low band loop antenna 106 are not grounded and are not directly driven by an electrical feed. Instead, the feed antenna 102 capacitively couples with and drives the high band loop antenna 104 and the low band loop antenna 106. The feed antenna 102 is directly and electrically connected to a transceiver (transmitter/receiver, not shown) that communicates signals to the RF feed antenna 102 and receives signals from the RF feed antenna 102 (e.g., as received by the high band loop antenna 104 and/or the low band loop antenna 106). The feed antenna 102 is positioned at the second ends (e.g., the second ends 150 and 154) of the high band loop antenna 104 and the ow band antenna 106.

The high band loop antenna 104 and the low band loop antenna 106 are configured to communicate (e.g., transmit and/or receive) in particular frequency ranges when driven by the RF feed antenna 102. For example, the low band loop antenna 106 is configured to communicate in a frequency range, for example, between 700 and 960 MHz, and the high band loop antenna 104 is configured to communicate in a frequency range, for example, between 1700 and 2700 MHz. Each of the high band loop antenna 104 and the low band loop antenna 106 may tunable in that that may be configurable to communicate in one or more bands of ranges of frequencies (e.g., RF band switching). For example, low band loop antenna 106 may be tunable such that it resonates (e.g., communicates) at a range of about 700 MHz or about 850 MHz, depending on the desired band. In another example, the high band loop antenna 104 may be tunable to resonate in a frequency of about 1900 MHz or about 2500 MHz, depending on the desired band. The low band loop antenna 106 and the high band loop antenna 104 may be tuned using one or more various tuning components that are connect to the first ends (e.g., 148 and 152) of the loop antennas (e.g., the low band loop antenna 104 and the high band loop antenna 106). Such tuning components are configured to vary the impendences to change the communication bands and may include variable inductors (not shown), RF tuning switches (e.g., RF tuning switches 116 and 120), etc. The RF tuning switches 116 and 120 are shown having two component paths 122 and 118, but it should be understood that the RF tuning switches 116 and 120 may have more than two component paths. For example, the using switches 116 and 120 may be radiofrequency microelectromechanical system (RFMEMS) switch configured to fine tune across many bands of RF communication signals. The component paths 122 and 118 are shown having inductors connected to a grounding point, but it should be understood that various electrical components may be used for impendence matching (e.g., tuning).

The antenna assembly 134 further includes a capacitive sensor module 110, which is electrically connected to the conductive elements 104 and 106 (e.g., the high band loop antenna 104 and the low band loop antenna 106). The capacitive sensor module 110 is electrically connected to the conductive elements 104 and 106 via inductors 112 and 114. The inductors 112 and 114 are configured to block RF transmissions from reaching the capacitive sensors 110. In other words, the inductors 112 and 114 acts as filters for the capacitive sensor module, and thus, the capacitive sensor module 110 is isolated from the "RF circuit." The capacitive sensor module 110 outputs a low frequency signal through the inductors 112 and 114 and charges the conductive elements 104 and 106 (e.g., the high band loop antenna 104 and the low band loop antenna 106). The low frequency signal is generally below 1 MHz and may be in a range from about 200 to 250 kHz. Similarly, the RF tuning switches 116 and 120 are isolated from the low frequency signals outputted by the capacitive sensor module 110 by the capacitors 124 and 126. Thus, the RF tuning switches 116 and 120 are isolated from the low frequency capacitive proximity sensing circuit.

The capacitive sensor module 110 is configured to detect capacitance changes caused by external capacitive objects (e.g., outside the enclosure 142) in proximity to the conductive elements 104 and 106 and, as a result, the mobile device 100. For example, one of the conductive elements 104 or 106 acts as a first electrode for the capacitive sensor module 110 and a capacitive external object acts a second electrode for the capacitive sensor module 110. During operation, the capacitive sensor outputs a low-frequency signal to the conductive elements 104 and 106 and monitors the capacitance associated with the conductive elements 104 and 106. The presence of a capacitive external object creates a change in capacitance that can be detected by the capacitive sensor module 110. Furthermore, changes in distance between the two conductive surfaces (e.g., the conductive element 104 and the capacitive external object) alters the capacitance, resulting in a detectable change in a waveform of the low frequency signal. The capacitive sensor module 110 uses the determined change in capacitance to determine a relative proximity of the capacitive external object. For example, the increase in capacitance attributed to the closing of the gap between the capacitive external object and the conductive element (104 or 106) may introduce a delay in the rising and falling edges of the low frequency signal wave form, which can be measured as an indication of the proximity of the capacitive external object. The mobile device 100 can use the determined proximity to adjust signal characteristics of the mobile device 100. Such adjustments may consider SAR legal limits and may include adjusting the RF transmission power output by the low band loop antenna 106 and the high band loop antenna 104. The capacitive sensor module 110 may contain hardware and/or software for outputting the low frequency signal, monitoring the signal, detecting changes in the signal, and determining capacitance changes in the conductive elements 104 and 106 caused by capacitive external object proximity, etc.

The arrangement of the various components of the antenna assembly 134 allows for the conductive elements 104 and 106 to act as both: (1) parasitic loop antennas that are capacitively driven by the directly fed RF feed antenna 102 and (2) electrodes for proximity detection by the capacitive sensor module 110. Because the capacitive sensor is isolated from the RF signals detected by the loop antennas 104 and 106 and the switches 120 and 116 are isolated from the low frequency signal output from the capacitive sensor, the RF communication signals do not interfere with the low frequency signal for capacitive proximity detection. Likewise, the low frequency signal for capacitive proximity detection does not interfere with RF communication signals.

In implementations, the low band loop antenna 106 and the high band loop antenna 104 are insulated from the RF feed antenna 102 and the enclosure 142 by an insulating element 108. The insulating element 108 may be formed of rubber, for example, and impedes interference by other metal elements (e.g., a metal enclosure) of the mobile device with communication to and from the low band loop antenna 106 and the high band loop antenna 104. Furthermore, the enclosure 142 is illustrated as not extending around the top edge 144 of the mobile device 100, but it should be understood that the enclosure 142 may extend around the top edge 144 of the mobile device (e.g., around a top of the display 132) and still be insulated from the conductive elements 104 and 106 by the insulating element 108.

Figure 2:
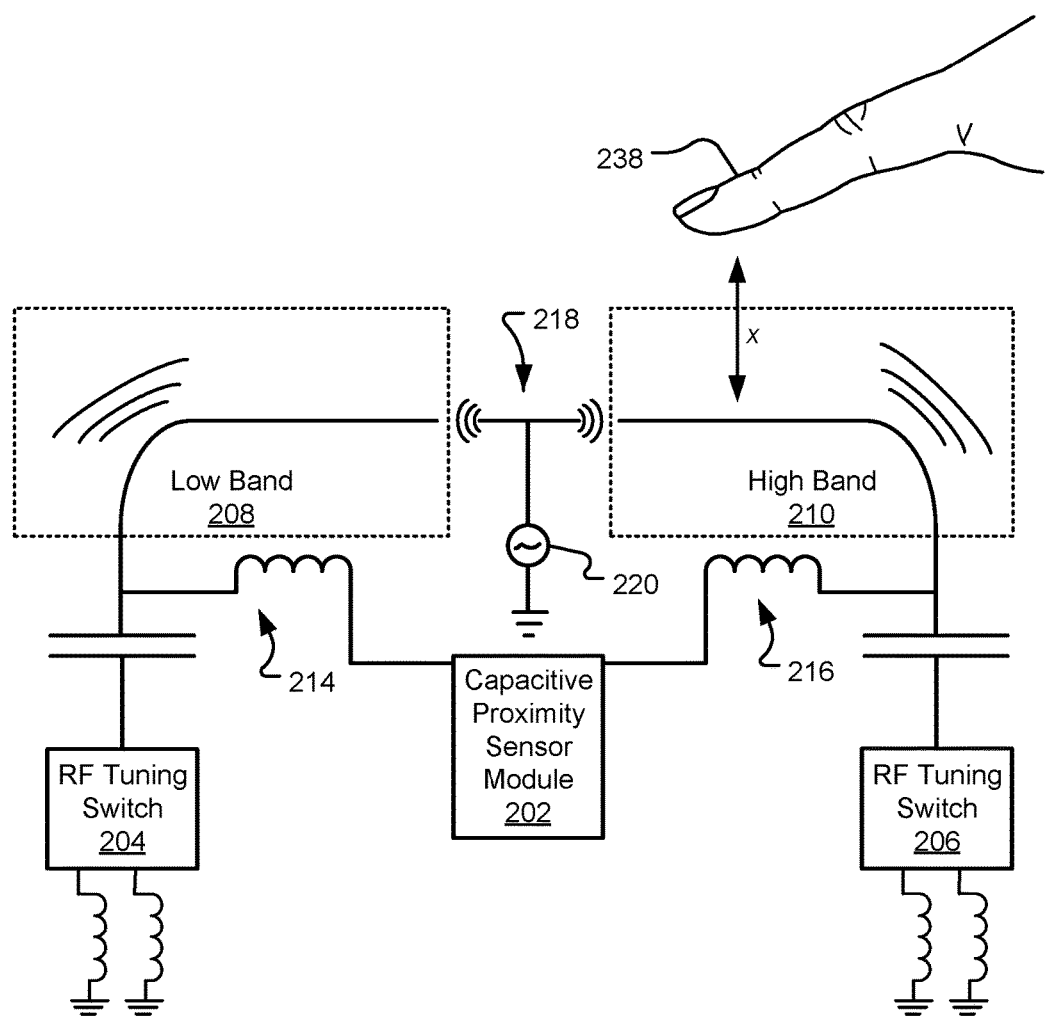
FIG. 2 illustrates an example circuit diagram for a dual loop antenna with integrated proximity sensing.

FIG. 2 illustrates an example circuit diagram 200 for a dual loop antenna with integrated proximity sensing. The circuit diagram 200 includes conductive elements (e.g., a low band loop antenna 208 a high band loop antenna 210), a radiofrequency (RF) feed antenna 218, a capacitive proximity sensor module 202, RF tuning switches 204 and 206 and various electrical components. The RF feed antenna 218 is electrically excited by an RF feed 220, which may be connected to transceiver or receiver circuitry (not shown). The transceiver circuitry electrically excites the RF feed antenna 218 with an electrical signal containing communication data. The RF feed antenna 218 is positioned to capacitively couple with the low band loop antenna 208 and the high band loop antenna 210, which are conductive elements that are configured to resonate at a RF communication band when driven by the RF feed antenna 218. Thus, when the RF feed antenna 218 drives the low band loop antenna 208 and the high band loop antenna 210 with a signal containing communication data, the low band loop antenna 208 and the high band loop antenna 210 transmit a carrier wave at an RF communication band containing the communication data. Similarly, both the low band loop antenna and the high band loop antenna, when driven by the RF feed antenna 218 such that the RF feed antenna 219 is capacitively coupled with the low band loop antenna 208 and the high band loop antenna 210, the low band loop antenna 208 and the high band loop antenna 208 may detect and receive communication signals at the RF band (e.g., a low band and a high band) containing communication data. For example, the low band loop antenna 208 is configured (e.g., sized, shaped, and tuned) to resonate at an 850 MHz radiofrequency band when driven by the RF feed antenna 218. If the low band loop antenna 208 detects a communication signal (e.g., a carrier wave) at t\a frequency of 850 MHz, the low band loop antenna 208 receives the communication signal, which is transmitted to the RF feed antenna 220. The RF feed antenna 218 communicates the received communication signal as an electrical signal which is then transmitted to the transceiver (not shown). are conductive elements that are driven to resonate by the RF feed antenna 218.

The low band loop antenna 208 and the high band loop antenna 210 are configured to resonate (e.g., communicate) at a particular RF communication band. For example, the low band loop antenna is configured to resonate at a RF communication band in the range of 700 to 960 MHz, and the high band loop antenna 210 is configured to resonate at a RF communication band in the range of 1900 MHz to 2500 MHz. The particular RF communication band of resonation may depend on the RF tuning switches 204 and 206. For example, the RF tuning switch 204 may selectively tune the low band loop antenna at a particular RF communication band (e.g., about 850 MHz) within the range of 800 to 960 MHz. The RF tuning switch 204 is communicatively (e.g., electrically) connected to a number of communication paths 226 with various electrical components (e.g., inductors) that are used to tune the low band loop antenna 208. The RF tuning switch 204 may selectively connect a particular communication path of the number of communication paths 226 to tune the low band loop antenna to communicate at a particular frequency within the low band range (e.g., 700 to 960 MHz). The RF tuning switch 206 is communicatively connected to the high band loop antenna 210 and may selectively tune the high band loop antenna 210 to communicate at a particular RF band within the high band range (e.g., 1900 to 2500 MHz). In various implementations, the RF tuning switches 204 and 206 may be variable inductors.

The capacitive proximity sensor module 202 may include software and/or hardware that includes circuitry configured to detect capacitance changes in the conductive elements (e.g., the low band antenna 208 and the high band antenna 210). Such circuitry may be a current meter or other suitable measurement circuit for monitoring signals associated with the capacitor electrode(s) formed by conductive structures (e.g., the low band antenna 208 or the high band antenna 210 and a capacitive external object). The capacitive proximity sensor module 202 outputs a low frequency electronic signal to the low band antenna 208 and/or the high band antenna 210. The low frequency electronic signal is communicated between the low band antenna 208 and the capacitive proximity sensor module 202 and/or between the high band antenna 210 and the capacitive proximity sensor module 202. The low frequency electronic signal creates an electric field at the conductive elements. A capacitive external object (e.g., a finger 238) in proximity to the low band antenna 208 and/or the high band antenna 210 interacts with the electric fields causing capacitance changes, which are detectable by the capacitive proximity sensor module 202. As the capacitive external object moves closer to the high band antenna 210 (e.g., a distance x decreases), the capacitance change increases. The capacitive proximity sensor module 202 detects the changes in the low frequency signal (e.g., change in amplitude, frequency, or rise/fall time of the low frequency signal waveform) and evaluates the changes in the signal to detect capacitance changes that would indicate proximity of the capacitive external object (e.g., the finger 238). A mobile device with the antenna circuitry 200 uses the determined proximity to adjust signal characteristics of the mobile device 100. Such adjustments may consider SAR legal limits and may include adjusting the RF transmission power output by the low band loop antenna 208 and/or the high band loop antenna 210. In the illustrated implementation, the capacitive external object is the finger 238. However, it should be understood that the capacitive external object may be any object capable of storing electrical charges and causing changes in the low frequency signal.

The capacitive proximity sensor module 202 is isolated from the RF communication signals communicated between each of the low band antenna 208 and the high band antenna 210 and the respective RF tuning switches (e.g., the RF tuning switch 204 and the RF tuning switch 206) by inductors 214 and 216. For example, a RF communication signal (e.g., a RF band) communicated between the low band antenna 208 and the RF tuning switch 204 is blocked or filtered from reaching the capacitive sensor 214. Similarly, the inductor 216 blocks/filters the RF communication signal (e.g., RF band) communicated between the high band antenna 210 and the RF tuning switch 206. As such, the high band antenna 210 (e.g., the conductive element), the inductor 216 and the capacitive proximity sensor module 202 acts as an open circuit for the low frequency signal output by the capacitive proximity sensor module 202. Similarly, the low band antenna 208, the inductor 214 and the capacitive proximity sensor module 202 is an open circuit for the low frequency signal output by the capacitive proximity sensor module 202.

In various implementations, a device may include more than one capacitive proximity sensor module 202. In this example implementation, a capacitive proximity sensor module may be included for both the low band antenna 208 and the high band antenna 210. Furthermore, in various implementations, the detected capacitance of the low band antenna 208 and the high band antenna 210 may be compared to determine a relative proximity and direction of the capacitive external object such as the finger 238. For example, if the capacitance change detected at the high band antenna 210 is greater than the capacitance change at the low band antenna 208, then it may be determined that the capacitive external object (e.g., the finger 238) is in a direction closer to the high band antenna 210. Other comparisons of capacitance changes to determine range and/or direction of the capacitive external object are contemplated. In implementations utilizing more than one antenna assembly (e.g., a second low band antenna, high band loop antenna, proximity sensor module, and switches), the various proximity detections of the antenna assemblies may be compared to determine range and/or direction of a capacitive external object.

In the described implementation, the conductive elements (208 and 210) are configured to concurrently communicate in the frequency band of RF signals and communicate the low frequency signal for proximity detection. In other words, the low frequency band for proximity detection is communicated between the conductive elements 208 and 210 while the conductive element is communicating the band of RF signals (and being RF band switched by the RF tuning switches). Concurrent communication/transmission is possible because the distance between the respective frequencies (e.g., the low frequency signal (250 kHz, for example) is distant from the high frequency RF signals (950 MHz, for example)). In various implementations, the low frequency signal for proximity detection and the high frequency RF signals may be time-division multiplexed (TDM) through the antenna assembly.

Figure 3:
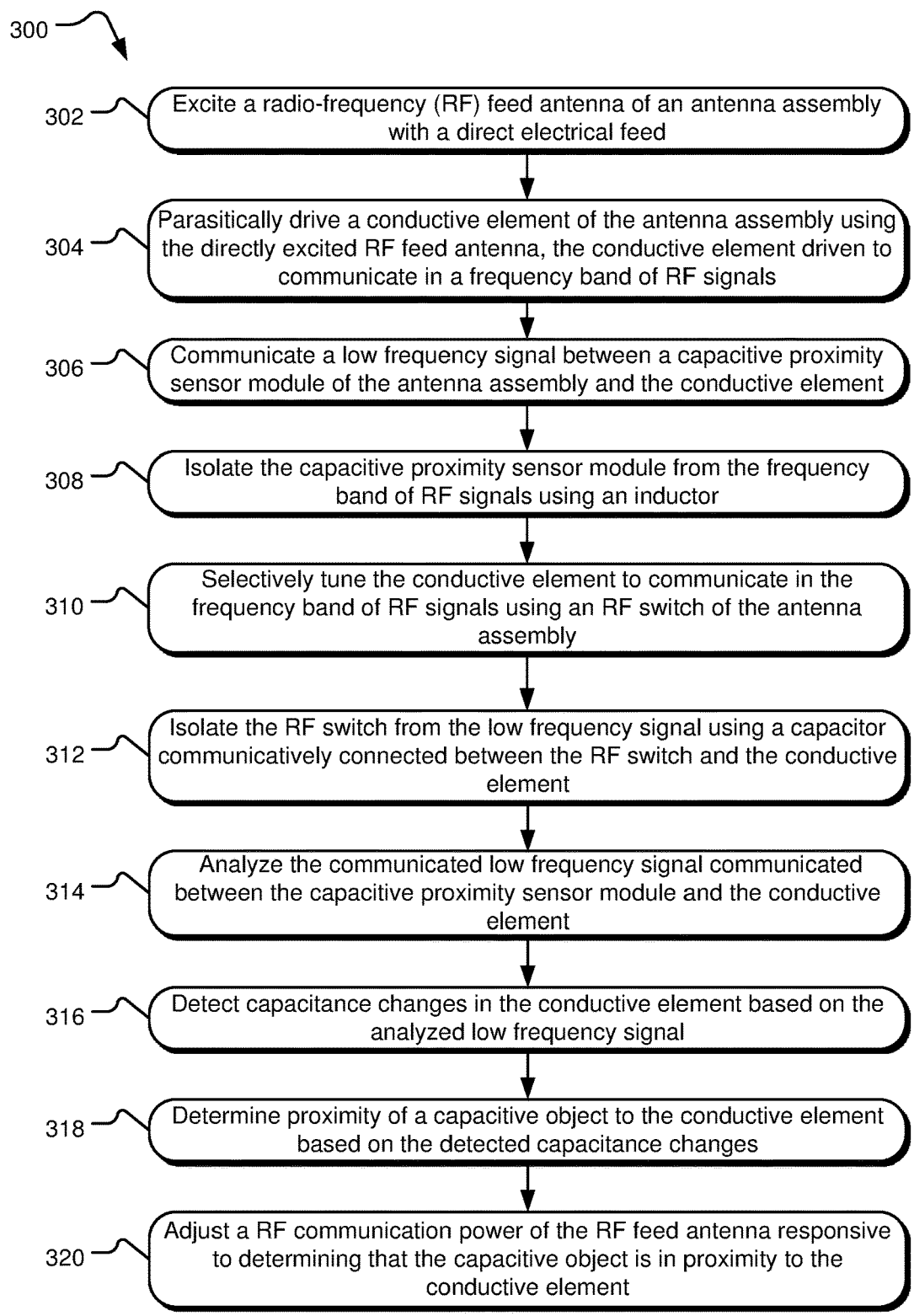
FIG. 3 illustrates example operations for radiofrequency (RF) transmission and proximity detection using the dual-loop antenna with integrated proximity sensing described herein.

FIG. 3 illustrates example operations 300 for radiofrequency (RF) transmission and proximity detection using the dual-loop antenna with integrated proximity sensing described herein. The operations 300 are for RF communication and proximity detecting using a conductive element (e.g., a loop antenna structure), but it should be understood that the operations 300 are applicable to a dual loop antenna structure (e.g., two conductive elements). An exciting operation 302 excites a radiofrequency (RF) feed antenna of an antenna assembly with a direct electrical feed. The electrical feed may contain communication data. A parasitically driving operation 304 parasitically drives a conductive element of the antenna assembly using the directly excited RF feed antenna. The conductive element is driven to communicate in a frequency band of RF signals. The conductive element may be configured as a high band loop antenna structure or a low band loop antenna structure. Such configuration may depend on, for example, the size and shape of the conductive element.

A communicating operation 306 communicates a low frequency signal between a capacitive proximity sensor module of the antenna assembly and the conductive element. The capacitive proximity sensor module drives the conductive element with the low frequency signal. It should be understood "between" means that the low frequency signal is communicated by (or on) the conductive element. In various implementations, the low frequency signal is communicated between the conductive element and the capacitive proximity sensor module while the conductive element is communicating in the frequency band of RF signals (e.g., the RF signals are traveling being communicated on the conductive element concurrently with the low frequency signals). The low frequency signal is output by the capacitive proximity sensor module. An isolating operation 308 isolates the capacitive proximity sensor module from the frequency band of RF signals using an inductor. The inductor may be communicatively (e.g., electrically) connected between the capacitive proximity sensor circuitry and the conductive element. The inductor allows the low frequency signals to be communicated between the capacitive proximity sensor module but blocks the RF signals from reaching the capacitive proximity sensor module.

A selective tuning operation 310 selectively tunes the conductive element to communicate in the frequency band of RF signals using an RF tuning switch of the antenna assembly. In various implementations, a variable inductor may be used in place of the RF tuning switch. The particular RF band of communication may depend on a current location, carrier, etc. The RF tuning switch may be a switch communicatively (e.g., electrically) connected to a plurality of communication paths with various electrical components (e.g., inductors) that are configured for tuning the conductive element to a particular RF communication band. The switch may be a radiofrequency microelectromechanical system (RFMEMS) switch. A second isolating operation 308 isolates the RF tuning switch from the low frequency signal using a capacitor. The capacitor is communicatively/electrically connected between the RF tuning switch and the conductive element. The capacitor blocks the low frequency signal from being communicated to the RF tuning switch.

An analyzing operation 314 analyzes the low frequency signal communicated between the capacitive proximity sensor module and the conductive element. A detecting operation 316 detects capacitive changes in the conductive element based on the analyzed low frequency signal. A wave form of the low frequency signal may be analyzed to detect capacitance changes. The detecting operation may detect capacitance changes by detecting changes in the waveform (e.g., a change in amplitude, frequency, or rise/fall times of the low frequency signal waveform). A determining operation 318 determines proximity of a capacitive object to the conductive element. The determining operation 318 can detect type of material of the object (e.g., biological material such as a human finger) based on the detected capacitance changes. An adjusting operation 320 adjusts a RF communication power of the RF feed antenna responsive to determining that an object is proximity to the conductive element. Such adjustment may account for SAR legal limits.

Figure 4:
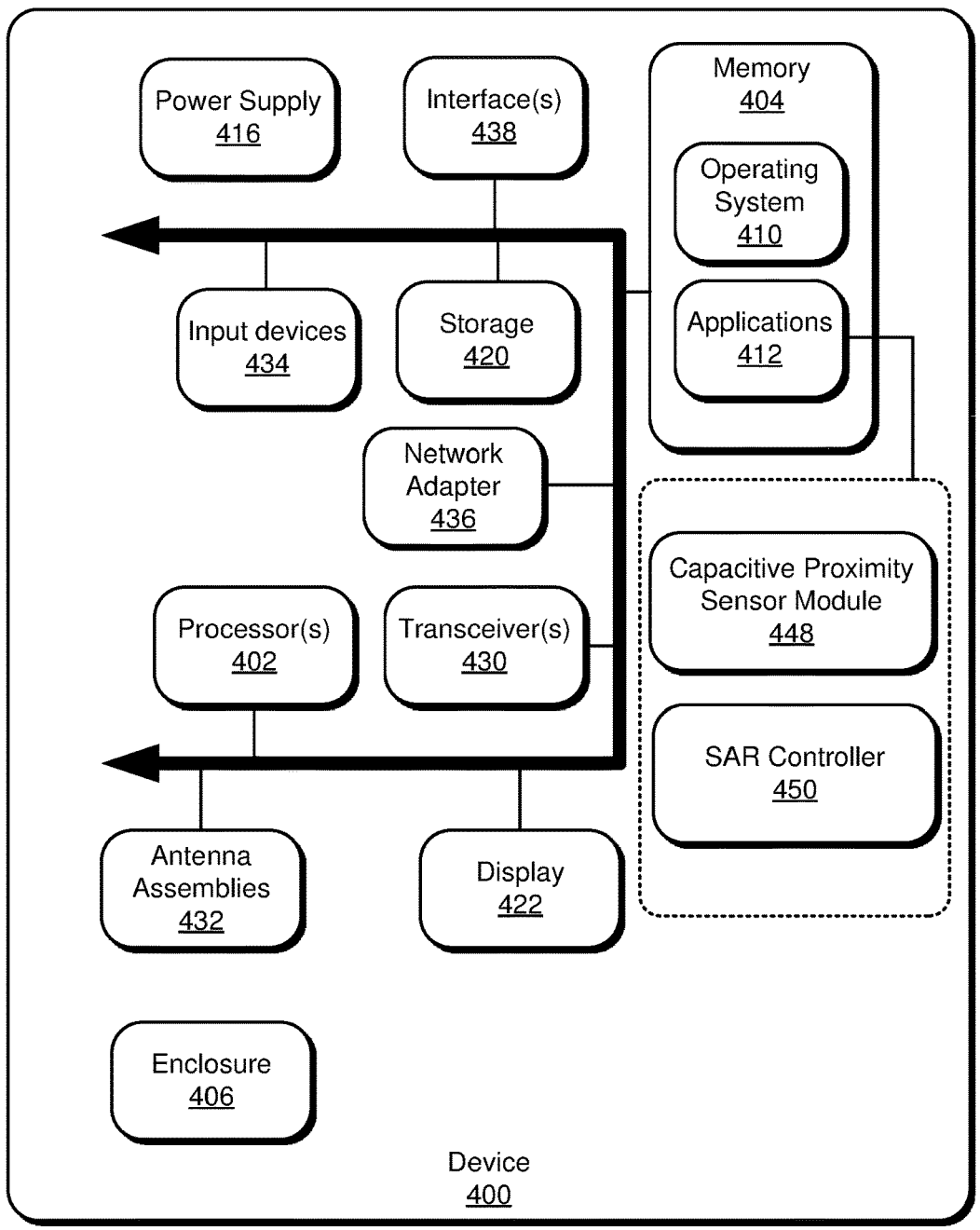
FIG. 4 illustrates an example device for utilizing the dual loop antenna with integrated proximity sensing.

FIG. 4 illustrates an example device 400 for utilizing the dual loop antenna with integrated proximity sensing. The device 400 may be a client device such as a laptop, mobile device, desktop, tablet, or a server/cloud device. The device 400 includes one or more processor(s) 402, and a memory 404. The memory 404 generally includes both volatile memory (e.g., RAM) and non-volatile memory (e.g., flash memory). An operating system 410 resides in the memory 404 and is executed by the processor(s) 402. The device 400 includes an enclosure 406 that encloses various components of the device 400 (e.g., the processors 402 and the memory 404). The enclosure may be partially formed of metal or other suitable material.

One or more application programs 412 modules or segments, such as a capacitive proximity sensor module 480 and a SAR controller 450 are loaded in the memory 404 and/or storage 420 and executed by the processor(s) 402. Data such as capacitance measurements, location information, RF band information, SAR thresholds and data, etc. may be loaded into memory 404 or storage 420 and may be retrievable by the processor(s) 402 for use in the by the capacitive proximity sensor module 448, the SAR controller 450, etc. The storage 420 may be local to the device 400 or may be remote and communicatively connected to the device 400. The storage 420 may store resources that are requestable by client devices (not shown).

The device 400 includes a power supply 416, which is powered by one or more batteries or other power sources and which provides power to other components of the device 400. The power supply 416 may also be connected to an external power source that overrides or recharges the built-in batteries or other power sources.

The device 400 may include one or more communication transceivers 430 which may be connected to one or more antenna assemblies 432 to provide network connectivity (e.g., mobile phone network, Wi-Fi®, Bluetooth®, etc.) to one or more other servers and/or client devices (e.g., mobile devices, desktop computers, or laptop computers). The antenna assemblies 432 may contain one or more RF tuning switch(es) that may be controlled by the capacitive proximity sensor module 448, the SAR controller 450, the network adapter 436, the transceivers 430 etc. to selectively switch RF communication bands in the antenna assemblies 432. Furthermore, the capacitive proximity sensor module 448 may be part of the one or more antenna assemblies 432. Furthermore, one or more conductive element of the one or more antenna assemblies 432 may be positioned in the enclosure 406. The device 400 may further include a network adapter 436, which is a type of communication device. The device 400 may use the adapter and any other types of communication devices for establishing connections over a wide-area network (WAN) or local-area network (LAN). It should be appreciated that the network connections shown are exemplary and that other communications devices and means for establishing a communications link between the device 400 and other devices may be used.

The device 400 may include one or more input devices 434 such that a user may enter commands and information (e.g., a keyboard or mouse). These and other input devices may be coupled to the server by one or more interfaces 438 such as a serial port interface, parallel port, universal serial bus (USB), etc. The device 400 may further include a display 422 such as a touch screen display.

The device 400 may include a variety of tangible computer-readable storage media and intangible computer-readable communication signals. Tangible computer-readable storage can be embodied by any available media that can be accessed by the device 400 and includes both volatile and nonvolatile storage media, removable and non-removable storage media. Tangible computer-readable storage media excludes intangible communications signals and includes volatile and nonvolatile, removable and non-removable storage media implemented in any method or technology for storage of information such as computer readable instructions, data structures, program modules or other data. Tangible computer-readable storage media includes, but is not limited to, RAM, ROM, EEPROM, flash memory or other memory technology, CDROM, digital versatile disks (DVD) or other optical disk storage, magnetic cassettes, magnetic tape, magnetic disk storage or other magnetic storage devices, or any other tangible medium which can be used to store the desired information and which can be accessed by the device 400. In contrast to tangible computer-readable storage media, intangible computer-readable communication signals may embody computer readable instructions, data structures, program modules or other data resident in a modulated data signal, such as a carrier wave or other signal transport mechanism. The term "modulated data signal" means a signal that has one or more of its characteristics set or changed in such a manner as to encode information in the signal. By way of example, and not limitation, intangible communication signals include signals traveling through wired media such as a wired network or direct-wired connection, and wireless media such as acoustic, RF, infrared, and other wireless media.

An example antenna assembly configured to detect proximity of a capacitive object includes a conductive element, a capacitive proximity sensor module electrically connected to the conductive element, and a radiofrequency (RF) feed antenna positioned to parasitically drive the conductive element to communicate in a frequency band of RF signals. The capacitive proximity sensor module drives the conductive element to detect proximity of the capacitive object to the conductive element.

An antenna assembly of any preceding antenna assembly includes a low frequency signal being communicated from the capacitive proximity sensor module to drive the conductive element to detect proximity of the capacitive object concurrently with the frequency band of RF signals being communicated by the conductive element. A frequency of the low frequency signal is less than a frequency of the frequency band of RF signals.

An antenna assembly of any preceding antenna assembly a low frequency signal being communicated from the capacitive proximity sensor module to drive the conductive element to detect proximity of the capacitive object concurrently with the frequency band of RF signals being communicated by the conductive element. The antenna assembly further includes an inductor communicatively connected between the conductive element and the capacitive proximity sensor module. The inductor communicates the low frequency signal between the conductive element and the capacitive proximity sensor module and isolating the capacitive proximity sensor module from the frequency band of RF signals. A frequency of the low frequency signal is less than a frequency of the frequency band of RF signals.

An antenna assembly of any preceding antenna assembly includes a low frequency signal being communicated from the capacitive proximity sensor module to drive the conductive element to detect proximity of the capacitive object concurrently with the frequency band of RF signals being communicated by the conductive element. The antenna assembly further includes an RF tuning switch communicatively connected to the conductive element and configured to selectively tune the conductive element to communicate in the frequency band of RF signals. The antenna assembly further includes a capacitor communicatively connected between the RF tuning switch and the conductive element, the capacitor isolating the RF tuning switch from the low frequency signal communicated between the conductive element and the capacitive proximity sensor module. A frequency of the low frequency signal is less than a frequency of the frequency band of RF signals.

An antenna assembly of any preceding antenna assembly includes a second conductive element. The RF feed antenna is positioned to parasitically drive the second conductive element to communicate in a second frequency band of RF signals, the capacitive proximity sensor module using the second conductive element to detect proximity of the capacitive object to the second conductive element.

An antenna assembly of any preceding antenna assembly includes a second conductive element. The RF feed antenna is positioned to parasitically drive the second conductive element to communicate in a second frequency band of RF signals, the capacitive proximity sensor module using the second conductive element to detect proximity of the capacitive object to the second conductive element. A low frequency signal is communicated from the capacitive proximity sensor module to drive the second conductive element. The antenna assembly further includes an inductor communicatively connected between the second conductive element and the capacitive proximity sensor module, the inductor communicating the low frequency signal between the second conductive element and the capacitive proximity sensor module and isolating the capacitive proximity sensor module from the second frequency band of RF signals. A frequency of the low frequency signal is less than a frequency of the frequency band of RF signals.

An antenna assembly of any preceding antenna includes a second conductive element. The RF feed antenna is positioned to parasitically drive the second conductive element to communicate in a second frequency band of RF signals, the capacitive proximity sensor module using the second conductive element to detect proximity of the capacitive object to the second conductive element. A low frequency signal is communicated from the capacitive proximity sensor module to drive the second conductive element. The antenna assembly further includes an RF tuning switch communicatively connected to the second conductive element and configured to selectively tune the second conductive element to communicate in the second frequency band of the RF signals. The antenna assembly further includes a capacitor communicatively connected between the RF tuning switch and the second conductive element, the capacitor isolating the RF tuning switch from the low frequency signal communicated between the second conductive element and the capacitive proximity sensor module. A frequency of the low frequency signal is less than a frequency of the frequency band of RF signals.

An antenna assembly of any preceding antenna assembly further includes the conductive element forming a portion of an enclosure of an electronic device.

An example method for detecting proximity of a capacitive object includes exciting a radiofrequency (RF) feed antenna with a direct feed; parasitically driving a conductive element using the directly excited RF feed antenna, the conductive element driven to communicate in a frequency band of RF signals; and detecting proximity of the capacitive object to the conductive element with a capacitive proximity sensor module electrically connected to the conductive element, the capacitive proximity sensor module driving the conductive element to detect proximity of the capacitive object.

An example method of any preceding method further includes concurrently communicating a low frequency signal between the capacitive proximity sensor module and the conductive element to detect proximity of the capacitive object with the frequency band of RF signals being communicated by the conductive element. A frequency of the low frequency signal is less than a frequency of the frequency band of RF signals.

An example method of any preceding method further includes driving the conductive element with a low frequency signal to detect proximity of the capacitive object, and isolating the capacitive proximity sensor module from the frequency band of RF signals using an inductor, the inductor communicatively connected between the conductive element and the capacitive proximity sensor module. A frequency of the low frequency signal is less than a frequency of the frequency band of RF signals.

An example method of any preceding method further includes driving the conductive element with a low frequency signal to detect proximity of the capacitive object; selectively tuning the conductive element to communicate in the frequency band of RF signals using an RF tuning switch, the RF tuning switch electrically connected to the conductive element; and isolating the RF tuning switch from the low frequency signal communicated between the conductive element and the capacitive proximity sensor module using a capacitor electrically connected between the RF tuning switch and the conductive element. A frequency of the low frequency signal is less than a frequency of the frequency band of RF signals.

An example method of any preceding method further includes parasitically driving a second conductive element using the radiofrequency (RF) feed, the second conductive element driven to communicate in a second frequency band of RF signals; and detecting proximity of a capacitive object to the second conductive element using the capacitive proximity sensor module, the capacitive proximity sensor module electrically connected to the second conductive element and driving the second conductive element to detect proximity of the capacitive object to the second conductive element.

An example method of any preceding method includes parasitically driving a second conductive element using the radiofrequency (RF) feed, the second conductive element driven to communicate in a second frequency band of RF signals; driving the second conductive element with a low frequency signal to detect proximity of the capacitive object to the second conductive element; and isolating the capacitive proximity sensor module from the second frequency band of RF signals using an inductor, the inductor electrically connected between the second conductive element and the capacitive proximity sensor module. A frequency of the low frequency signal is less than a frequency of the frequency band of RF signals.

An example method of any preceding method includes parasitically driving a second conductive element using the radiofrequency (RF) feed, the second conductive element driven to communicate in a second frequency band of RF signals; driving the second conductive element with a low frequency signal to detect proximity of the capacitive object to the second conductive element; selectively tuning the second conductive element to communicate in the second frequency band of RF signals using an RF tuning switch, the RF tuning switch electrically connected to the second conductive element; and isolating the RF tuning switch from the low frequency signal communicated between the second conductive element and the capacitive proximity sensor module using a capacitor electrically connected between the RF tuning switch and the second conductive element. A frequency of the low frequency signal is less than a frequency of the frequency band of RF signals.

An example method of any preceding method further includes the conductive element being positioned in an enclosure of an electronic device.

An example electronic device configured to detect proximity of a capacitive object includes a conductive element; a capacitive proximity sensor module electrically connected to the conductive element, the capacitive proximity sensor module driving the conductive element to detect proximity of the capacitive object to the conductive element; and a radiofrequency (RF) feed antenna positioned to parasitically drive the conductive element to communicate in a frequency band of RF signals.

An example electronic device of any preceding electronic device includes a low frequency signal being communicated from the capacitive proximity sensor module to drive the conductive element to detect proximity of the capacitive object concurrently with the frequency band of RF signals being communicated by the conductive element. A frequency of the low frequency signal is less than a frequency of the frequency band of RF signals An example electronic device of any preceding electronic device includes the conductive element being positioned in an enclosure of the electronic device.

An example electronic device of any preceding electronic device includes a second conductive element and the RF feed antenna being positioned to parasitically drive the second conductive element to communicate in a second frequency band of RF signals.

An example system for detecting proximity of a capacitive object includes means for exciting a radiofrequency (RF) feed antenna with a direct feed; parasitically driving a conductive element using the directly excited RF feed antenna, the conductive element driven to communicate in a frequency band of RF signals; and detecting proximity of the capacitive object to the conductive element with a capacitive proximity sensor module electrically connected to the conductive element, the capacitive proximity sensor module supporting driving the conductive element to detect proximity of the capacitive object.

Another example system of any preceding system includes means for concurrently communicating a low frequency signal between the capacitive proximity sensor module and the conductive element to detect proximity of the capacitive object with the frequency band of RF signals being communicated by the conductive element. A frequency of the low frequency signal is less than a frequency of the frequency band of RF signals.

Another example system of any preceding system includes means for driving the conductive element with a low frequency signal to detect proximity of the capacitive object; and isolating the capacitive proximity sensor module from the frequency band of RF signals using an inductor, the inductor communicatively connected between the conductive element and the capacitive proximity sensor module and supporting.

Another example system of any preceding system includes means for driving the conductive element with a low frequency signal to detect proximity of the capacitive object; selectively tuning the conductive element to communicate in the frequency band of RF signals using an RF tuning switch, the RF tuning switch supporting being electrically connected to the conductive element; and isolating the RF tuning switch from the low frequency signal communicated between the conductive element and the capacitive proximity sensor module using a capacitor electrically connected between the RF tuning switch and the conductive element.

Another example system of any preceding system includes means for parasitically driving a second conductive element using the radiofrequency (RF) feed, the second conductive element supporting being driven to communicate in a second frequency band of RF signals. The system further includes support for detecting proximity of a capacitive object to the second conductive element using the capacitive proximity sensor module, the capacitive proximity sensor module electrically connected to the second conductive element and supporting driving the second conductive element to detect proximity of the capacitive object to the second conductive element.

Another example system of any preceding system includes means for parasitically driving a second conductive element using the radiofrequency (RF) feed, the second conductive element supporting being driven to communicate in a second frequency band of RF signals. The system further includes means for driving the second conductive element with a low frequency signal to detect proximity of the capacitive object to the second conductive element, and isolating the capacitive proximity sensor module from the second frequency band of RF signals using an inductor. The inductor supporting being electrically connected between the second conductive element and the capacitive proximity sensor module and supporting communicating the low frequency signal between the conductive element and the capacitive proximity sensor module.

Another example system of any preceding system includes means for parasitically driving a second conductive element using the radiofrequency (RF) feed, the second conductive element driven to communicate in a second frequency band of RF signals; driving the second conductive element with a low frequency signal to detect proximity of the capacitive object to the second conductive element; selectively tuning the second conductive element to communicate in the second frequency band of RF signals using an RF tuning switch. The RF tuning switch supporting being electrically connected to the second conductive element. The system further including means for isolating the RF tuning switch from the low frequency signal communicated between the second conductive element and the capacitive proximity sensor module using a capacitor electrically connected between the RF tuning switch and the second conductive element.

Another example system of any preceding system includes support for the conductive element being positioned in an enclosure of an electronic device.

The implementations of the invention described herein are implemented as logical steps in one or more computer systems. The logical operations of the present invention are implemented (1) as a sequence of processor-implemented steps executing in one or more computer systems and (2) as interconnected machine or circuit modules within one or more computer systems. The implementation is a matter of choice, dependent on the performance requirements of the computer system implementing the invention. Accordingly, the logical operations making up the embodiments of the invention described herein are referred to variously as operations, steps, objects, or modules. Furthermore, it should be understood that logical operations may be performed in any order, adding and omitting as desired, unless explicitly claimed otherwise or a specific order is inherently necessitated by the claim language.

The above specification, examples, and data provide a complete description of the structure and use of exemplary embodiments of the invention. Since many implementations of the invention can be made without departing from the spirit and scope of the invention, the invention resides in the claims hereinafter appended. Furthermore, structural features of the different embodiments may be combined in yet another implementation without departing from the recited claims.

What is claimed is:

1. An antenna assembly configured to detect proximity of an object, the antenna assembly comprising:
    a conductive element including an antenna structure;
    a capacitive proximity sensor module electrically connected to the conductive element, the capacitive proximity sensor module driving the conductive element to detect proximity of the object to the conductive element;
    a radiofrequency (RF) feed antenna positioned to parasitically drive the conductive element for communications in a frequency band of RF signals; and
    a second conductive element including another antenna structure, the RF feed antenna being positioned to parasitically drive the second conductive element for communications in a second frequency band of RF signals, the capacitive proximity sensor module using the second conductive element to detect proximity of the object to the second conductive element.

2. The antenna assembly of claim 1 wherein a low frequency signal is communicated from the capacitive proximity sensor module to drive the conductive element to detect proximity of the object concurrently with the frequency band of RF signals being communicated by the conductive element, a frequency of the low frequency signal being less than a frequency of the frequency band of RF signals.

3. The antenna assembly of claim 1 wherein a low frequency signal is communicated from the capacitive proximity sensor module to drive the conductive element to detect proximity of the object to the conductive element, the antenna assembly further comprising:
    an inductor communicatively connected between the conductive element and the capacitive proximity sensor module, the inductor communicating the low frequency signal between the conductive element and the capacitive proximity sensor module and isolating the capacitive proximity sensor module from the frequency band of RF signals, a frequency of the low frequency signal being less than a frequency of the frequency band of RF signals.

4. The antenna assembly of claim 1 wherein a low frequency signal is communicated from the capacitive proximity sensor module to drive the conductive element to detect proximity of the object to the conductive element, the antenna assembly further comprising:
    an RF tuning switch communicatively connected to the conductive element and configured to selectively tune the conductive element for communications in the frequency band of RF signals; and
    a capacitor communicatively connected between the RF tuning switch and the conductive element, the capacitor isolating the RF tuning switch from the low frequency signal communicated between the conductive element and the capacitive proximity sensor module, a frequency of the low frequency signal being less than a frequency of the frequency band of RF signals.

5. The antenna assembly of claim 1, wherein
a low frequency signal is communicated from the capacitive proximity sensor module to drive the second conductive element, a frequency of the low frequency signal being less than a frequency of the frequency band of RF signals; the antenna assembly further comprising:
    an inductor communicatively connected between the second conductive element and the capacitive proximity sensor module, the inductor communicating the low frequency signal between the second conductive element and the capacitive proximity sensor module and isolating the capacitive proximity sensor module from the second frequency band of RF signals.

6. The antenna assembly of claim 1, wherein
the capacitive proximity sensor module drives the second conductive element to detect proximity of the object to the second conductive element using a low frequency signal communicated between the capacitive proximity sensor module and the second conductive element, a frequency of the low frequency signal being less than a frequency of the frequency band of RF signals; the antenna assembly further comprising:
    an RF tuning switch communicatively connected to the second conductive element and configured to selectively tune the second conductive element for communications in the second frequency band of the RF signals; and
    a capacitor communicatively connected between the RF tuning switch and the second conductive element, the capacitor isolating the RF tuning switch from the low frequency signal communicated between the second conductive element and the capacitive proximity sensor module.

7. The antenna assembly of claim 1 wherein the conductive element forms a portion of a metal enclosure of an electronic device.

8. A method for detecting proximity of an object comprising:
    exciting a radiofrequency (RF) feed antenna with a direct feed;
    parasitically driving a conductive element using the directly excited RF feed antenna, the conductive element driven for communications in a frequency band of RF signals, the conductive element including an antenna structure;
    parasitically driving a second conductive element using the radiofrequency (RF) feed, the second conductive element driven for communications in a second frequency band of RF signals, the second conductive element including another antenna structure; and
    detecting proximity of the object to the conductive element with a capacitive proximity sensor module electrically connected to the conductive element and the second conductive element, the capacitive proximity sensor module driving the conductive element and the second conductive element to detect proximity of the object.

9. The method of claim 8 further comprising:
    concurrently communicating a low frequency signal between the capacitive proximity sensor module and the conductive element to detect proximity of the object with the frequency band of RF signals being communicated by the conductive element, a frequency of the low frequency signal being less than a frequency of the frequency band of RF signals.

10. The method of claim 8 further comprising:
driving the conductive element with a low frequency signal to detect proximity of the object, a frequency of the low frequency signal being less than a frequency of the frequency band of RF signals; and
isolating the capacitive proximity sensor module from the frequency band of RF signals using an inductor, the inductor communicatively connected between the conductive element and the capacitive proximity sensor module.

11. The method of claim 8 further comprising:
driving the conductive element with a low frequency signal to detect proximity of the object, a frequency of the low frequency signal being less than a frequency of the frequency band of RF signals;
selectively tuning the conductive element for communications in the frequency band of RF signals using an RF tuning switch, the RF tuning switch electrically connected to the conductive element; and
isolating the RF tuning switch from the low frequency signal communicated between the conductive element and the capacitive proximity sensor module using a capacitor electrically connected between the RF tuning switch and the conductive element.

12. The method of claim 8 further comprising:
driving the second conductive element with a low frequency signal to detect proximity of the object to the second conductive element, a frequency of the low frequency signal being less than a frequency of the frequency band of RF signals; and
isolating the capacitive proximity sensor module from the second frequency band of RF signals using an inductor, the inductor electrically connected between the second conductive element and the capacitive proximity sensor module.

13. The method of claim 8 further comprising:
driving the second conductive element with a low frequency signal to detect proximity of the object to the second conductive element, a frequency of the low frequency signal being less than a frequency of the frequency band of RF signals;
selectively tuning the second conductive element for communications in the second frequency band of RF signals using an RF tuning switch, the RF tuning switch electrically connected to the second conductive element; and
isolating the RF tuning switch from the low frequency signal communicated between the second conductive element and the capacitive proximity sensor module using a capacitor electrically connected between the RF tuning switch and the second conductive element.

14. The method of claim 8 wherein the conductive element is positioned to form a portion of a metal enclosure of an electronic device.

15. An electronic device configured to detect proximity of an object comprising:
a conductive element including an antenna structure;
a second conductive element including another antenna structure;
a capacitive proximity sensor module electrically connected to the conductive element, the capacitive proximity sensor module driving the conductive element to detect proximity of the object to the conductive element; and
a radiofrequency (RF) feed antenna positioned to parasitically drive the conductive element for communications in a frequency band of RF signals and to parasitically drive the second conductive element for communications in a second frequency band of RF signals.

16. The electronic device of claim 15 wherein a low frequency signal is communicated from the capacitive proximity sensor module to drive the conductive element to detect proximity of the object concurrently with the frequency band of RF signals being communicated by the conductive element, a frequency of the low frequency signal being less than a frequency of the frequency band of RF signals.

17. The electronic device of claim 15 wherein the conductive element is positioned to form a portion of a metal enclosure of the electronic device.

* * * * *